(12) United States Patent
Fujimura (10) Patent No.: US 6,445,020 B2
(45) Date of Patent: Sep. 3, 2002

(54) SEMICONDUCTOR LIGHT-RECEIVING DEVICE

(75) Inventor: Yasushi Fujimura, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/817,355

(22) Filed: Mar. 22, 2001

(30) Foreign Application Priority Data

Mar. 22, 2000 (JP) ........................................ 2000-080687

(51) Int. Cl.[7] ............................................ H01L 27/148
(52) U.S. Cl. ...................... 257/225; 257/186; 257/438; 257/458
(58) Field of Search .......................... 257/14, 186, 432, 257/438, 457, 458, 461, 615, 632, 656; 250/551; 385/14

(56) References Cited

U.S. PATENT DOCUMENTS 5,391,910 A * 2/1995 Fujimura et al. ........... 257/458
5,434,426 A * 7/1995 Furuyama et al. .......... 250/551
5,521,994 A * 5/1996 Takeuchi et al. .............. 385/14
5,552,629 A * 9/1996 Watanabe .................... 257/438

OTHER PUBLICATIONS

Growth of VPE InP/InGaAs ON InP for Photodiode, Yoshiharu Yamauchi, et al., Journal of Crystal Growth 56 (1982) 402–409, North Holland Publishing Company.

* cited by examiner

Primary Examiner—Hoai Ho
Assistant Examiner—Mai-Huong Tran
(74) Attorney, Agent, or Firm—Smith, Gambrell & Russell, LLP (57) ABSTRACT

A semiconductor light-receiving device $1a$ comprises a first InP layer 12 having a first conductive type region $20a$, a second InP layer 16 having a second conductive type, and an InGaAs light-receiving layer 14 disposed between these layers 12, 16. The InP layer 16 of second conductive type has a maximum carrier concentration of $1\times10^{17}$ $cm^{-3}$ or higher. Because of this carrier concentration, the depletion layer caused by an applied reverse bias to extend into the InP layer 16 becomes sufficiently small. Therefore, this depletion layer spreads within the light-receiving layer 14 in which electron-hole pairs are generated. Hence, the applied voltage can fully be utilized for drifting generated carriers. Thus provided is a semiconductor light-receiving device in which the occurrence of wave tails is reduced.

10 Claims, 9 Drawing Sheets

SEMICONDUCTOR LIGHT-RECEIVING DEVICE

BACKGROUND OF THE INVENTION

1. Field of the Invention

The present invention relates to a semiconductor light-receiving device.

2. Related Background Art

Conventionally known as a semiconductor light-receiving device are p-i-n type photodiodes. A light-receiving device of this type comprises an n-type semiconductor substrate, an i-type InP buffer layer formed on this substrate, an i-type InP layer, and an InGaAs light-receiving layer disposed between a p-type InP layer and the i-type InP layer. The i-type InP layer is doped with a p-type dopant. Light incident on this semiconductor light-receiving device is absorbed in the light-receiving layer to be converted into current.

SUMMARY OF THE INVENTION

The inventor conducted measurements concerning response characteristics of a p-i-n type photodiode. These measurements were carried out in order to obtain response characteristics for a bit rate of about 1.25 Gb/s at various voltages applied across the semiconductor light-receiving device. In the measurements of response characteristics, the intensity of light introduced to the semiconductor light-receiving device was varied among some values.

The inventor found the following problem in the measurements. When the response characteristics are compared with each other over various conditions of applied voltages and light intensity, wave tails occur under conditions of relatively greater light intensity and lower applied voltages. These wave tails tend to disappear when the applied voltage is raised or when the light intensity is lowered. The inventor also found that the wave tails appeared only at falling edges of optical pulses in carefully observing the response characteristics.

Therefore, it is an object of the present invention to provide a semiconductor light-receiving device capable of reducing the occurrence of the wave tails.

The inventor conducted studies concerning the foregoing characteristics. In the measurements of the semiconductor light-receiving device, a reverse bias is applied to the device. The wave tails occur in the lower applied voltages. In view of this fact, it is presumed to relate to the drift of carriers generated in the device. The wave tails also occur in the greater light intensity. In view of this fact, the phenomenon becomes remarkable when the number of generated carriers is large. In addition, the wave tails only occurs in falling edges of optical pulses.

In view of these facts, it can be understood as follows: the wave tails may be caused by a number of carrier pairs, generated by a relatively high light intensity, that cannot move at a sufficient speed due to a relatively low drift voltage.

The semiconductor light-receiving device in accordance with the present invention comprises: (a) a first InP layer; (b) a second InP layer; and (c) an InGaAs layer light-receiving layer. The first InP layer includes a semiconductor region having a first conductive type. The first InP layer is provided on the second InP layer and the second InP layer includes a semiconductor regions having a second conductive type different from the first conductive type. The InGaAs light-receiving layer is provided between the first and second InP layers. The semiconductor region having a first conductive type in the second InP layer has a carrier concentration of $1 \times 10^{17}$ cm$^{-3}$ or higher.

Since the first conductive type semiconductor region has a carrier concentration of $1 \times 10^{17}$ cm$^{-3}$ or higher, the depletion region, generated by the applied reverse bias, is sufficiently reduced in the first InP layer. As a consequence, this depletion layer is mainly generated within the light-receiving layer in which electron-hole pairs are generated. Hence, the applied voltage can be fully utilized for drifting the generated carriers.

Thus configured first InP layer is provided on the substrate. The InGaAs light-receiving layer may have an i-type semiconductor region.

The semiconductor light-receiving device may be configured such that the first InP layer has a p-type semiconductor region, the second InP layer has an n-type semiconductor region, the InGaAs light-receiving layer has an i-type semiconductor region, and the substrate is an n-type semiconductor substrate.

The InGaAs light-receiving layer may have a profile of a first conductive type dopant concentration decreasing in a direction from the second InP layer to the first InP layer. This dopant profile defines the width of a high resistance region and the inclination of the impurity distribution curve in the light-receiving layer.

The substrate may be an InP substrate having a pair of surfaces. On one surface of the substrate, the semiconductor layers above are provided. The semiconductor light-receiving device may be a back entrance type device. The other surface may have a lens portion in a first region. The lens portion can provide the InGaAs light-receiving layer with condensed light. The lens portion is separated from the light receiving layer by the second conductive type InP substrate. The thickness of the second conductive type InP substrate can be, therefore, related to the focal length of the lens portion. The lens portion may include a monolithic lens.

The projection of the lens portion is made onto the other surface of the substrate to define a first projection area thereon. The projection of the second conductive type region is made onto one surface of the substrate to define a second projection area thereon. The first projection area may be larger than the second projection area. The smaller second projection area reduces the parasitic capacitance occurring due to the second conduction type semiconductor region.

The above-mentioned object and other objects, features, and advantages of the present invention will be clarified more easily from the following detailed descriptions of preferred embodiments of the present invention set forth with reference to the accompanying drawings.

BRIEF DESCRIPTION OF THE DRAWINGS

The teaching of the present invention will easily be understood in view of the following detailed descriptions with reference to the accompanying drawings, in which:

FIGS. 8A to 8C are frequency charts of a semiconductor light-receiving device having the profile shown in FIG. 3B;

FIGS. 9A to 9F are frequency charts of a semiconductor light receiving device for purposes of comparison.

DESCRIPTION OF THE PREFERRED EMBODIMENTS

In the following, preferred embodiments of the semiconductor light-receiving device in accordance with the present invention will be described in detail with reference to the drawings. In the drawings, constituents identical or similar to each other will be referred to with the same reference numerals.

Figure 1:
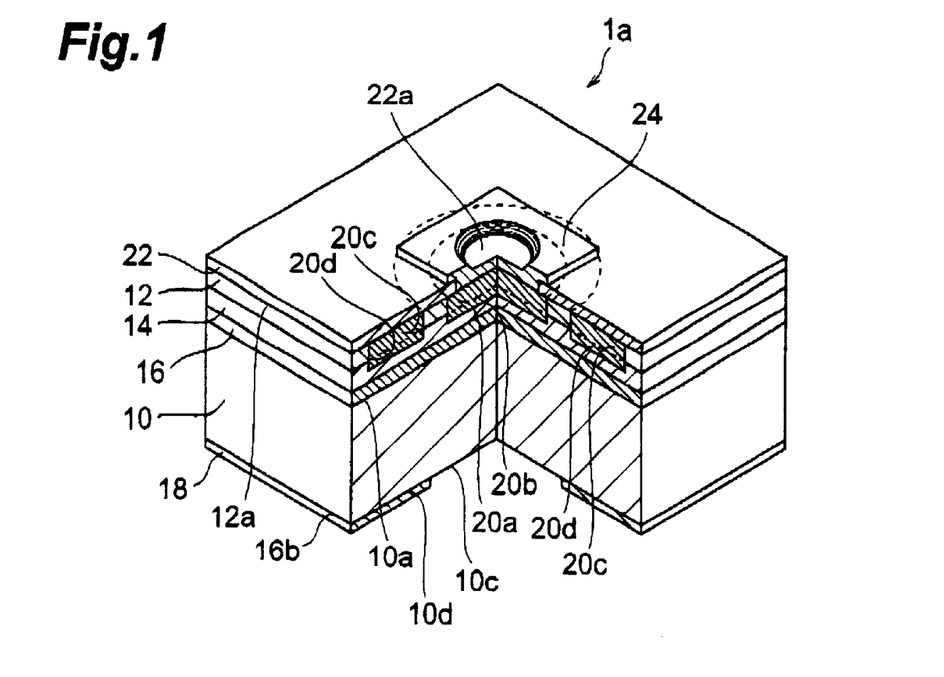
FIG. 1 is a perspective view of the semiconductor light receiving device in accordance with an embodiment.

FIG. 1 shows a perspective view of a semiconductor light-receiving device 1a in accordance with an embodiment of the present invention. The semiconductor light-receiving device 1a includes a photodiode such as a p-i-n type diode. The semiconductor light-receiving device 1a is employed as a light-receiving device for optical signals in optical communications. The semiconductor light-receiving device 1a comprises an n-type InP substrate 10, an i-type first InP layer 12, an i-type InGaAs light-receiving layer 14, a second InP layer 16, a first electrode 18, and a second electrode 24. The n-type InP substrate 10 has a first surface 10a and a second surface 10b opposite to the first surface 10a. The second InP layer 16, the i-type InGaAs light-receiving layer 14, and the i-type first InP layer 12 are successively arranged on the first surface 10a of n-type InP substrate 10. The second InP layer 16, the i-type InGas light-receiving layer 14, and the i-type first InP layer 12 can be grown in crystal growth methods such as organic metal vapor phase epitaxial growth method (OMVPE method) and molecular beam epitaxial growth method (MBE method), but the methods are not limited thereto. The semiconductor layers 12, 14, 16 can be grown epitaxially on the substrate in these film forming methods.

Typical thickness and carrier concentration values for the individual semiconductor layers are as follows:

|  | Thickness | Carrier concentration |
| --- | --- | --- |
| i-type 1st InP layer 12 | 1 to 2 μm | $1 \times 10^{16}$ cm$^{-3}$ or less |
| i-type InGaAs light-receiving layer 14 | 2 to 4 μm | $1 \times 10^{14}$ to $1 \times 10^{15}$ cm$^{-3}$ |
| n-type 2nd InP layer 16 | 1 to 2 μm | $1 \times 10^{17}$ cm$^{-3}$ or more |
| n-type InP substrate 10 |  | $1 \times 10^{18}$ cm$^{-3}$ or more |

The first InP layer 12 has a p-type semiconductor region 20a. The p-type semiconductor region 20a extends from the surface of first InP layer 12 so as to reach the InGaAs light-receiving layer 14. The p-type semiconductor region 20a is electrically connected to a p-type semiconductor region 20b at the interface between the first InP layer 12 and the InGaAs light-receiving layer 14. The p-type semiconductor region 20a may be doped with a p-type dopant such as Zn.

The p-type semiconductor regions 20a and 20b are formed only in a selected region of the layers 12, 14. This restrains the increase of parasitic capacitance in the p-i-n junction. The selected region defines a region contributing to photoelectric conversion in the InGaAs light-receiving layer 14. The p-type semiconductor regions 20a and 20b are formed by diffusing p-type dopant atoms into the first InP layer 12 and InGaAs light-receiving layer 14 from one surface of the semiconductor light-receiving device 1a.

P-type semiconductor regions 20c and 20d, separated from the p-type semiconductor regions 20a and 20b by a predetermined distance, are arranged so as to surround the p-type semiconductor regions 20a, 20b. These regions 20c, 20d are, therefore, useful for recombining the carriers generated by light incident in the outside of the light-receiving regions 20a, 20b. The regions 20c, 20d may be arranged on the periphery of the light-receiving regions 20a, 20b, or may surround the light-receiving regions 20a, 20b.

Although the second InP layer 16 itself is formed so as to exhibit n-type conductive type, a high-resistance i-type second InP layer may be formed instead of the second InP layer 16 and then partly provided with an n-type semiconductor region to form the second InP layer 16. In this configuration, the n-type semiconductor region formed later has a carrier concentration of $1 \times 10^{-17}$ cm$^{-3}$ or higher as well. This carrier concentration can also prevent the depletion layer from spreading into the second InP layer 16. In this configuration, the n-type semiconductor region and the p-type semiconductor region are arranged on the opposite sides of the i-type layer.

The second surface 10b of InP substrate 10 has a first region 10c and a second region 10d. The second region 10d is provided with the first electrode 18. Employed as the first electrode 18 is an electrode containing AuGe system material forming ohmic contact with the n-type semiconductor layer.

Since the first region 10c is not provided with the first electrode 18, incident light can pass therethrough to the InGaAs light-receiving layer 14. Since the first region 10c is positioned with respect to the p-type semiconductor regions 20a and 20b, the incident light is introduced by way of the first region 10c to reach a portion where photoelectric conversion occurs efficiently.

One surface 12a of the first InP layer 12 is provided with an insulating film 22 such as silicon oxide film or silicon nitride film. The insulating film 22 has an opening 22a provided so as to reach the p-type semiconductor region 20a. The second electrode 24 is arranged in the opening 22a and on the insulating film 22. Employed as the second electrode 24 is an electrode containing AuGe system material forming ohmic contact with the p-type semiconductor layer.

In this configuration, a high-resistance region, referred to as i-type region, within the InGaAs light-receiving layer 14 is arranged between the low-resistance p-type semiconductor region 20a, 20b (anode) and the low-resistance n-type semiconductor region 10, 16 (cathode).

For forming an optical window layer with respect to the light-receiving layer 14, each semiconductor layer composing the anode may have a band gap wider than that of the semiconductor material for the light-receiving layer 14. Likewise, each of the semiconductor layer and substrate 10 composing the cathode may have a band gap wider than that of the semiconductor material for the light-receiving layer 14. The light-receiving layer 14 can detect light having a wavelength transmittable through the window layer, e.g., 1.0 to 1.6 μm. In the semiconductor light-receiving device 1a, the light-receiving layer 14 can receive incident light by way of any window layer. On the other hand, the first electrode 18 and second electrode 24 can be formed of material through which light within such a wavelength range is not transmittable, i.e., light-shielding material such as a metal.

Figure 2:
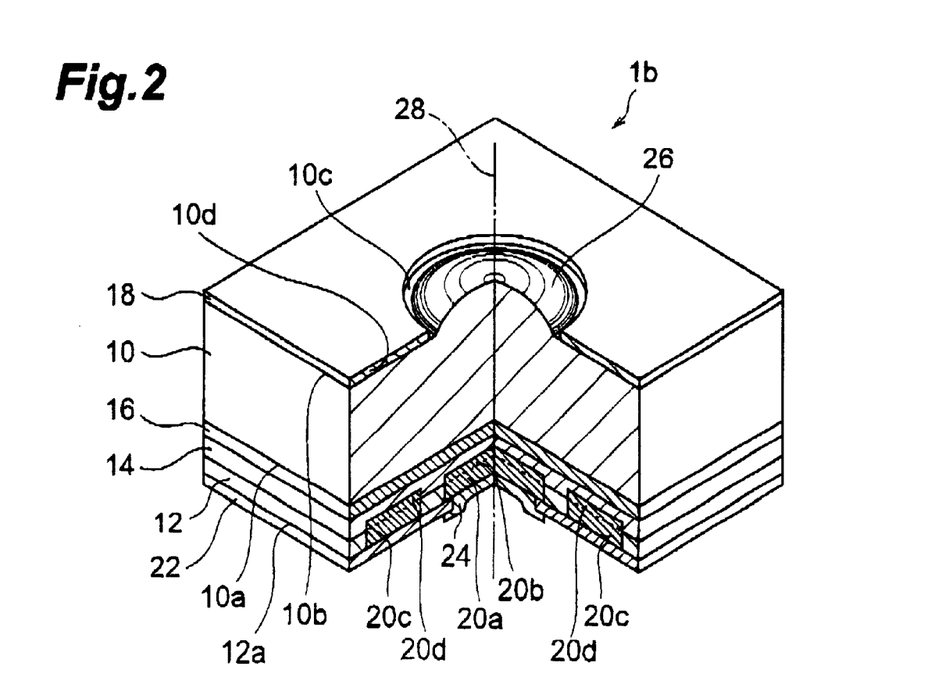
FIG. 2 is a perspective view of the semiconductor light receiving device in accordance with another embodiment.

FIG. 2 is a perspective view showing a semiconductor light-receiving device 1b in accordance with another embodiment of the present invention. The semiconductor light-receiving device 1b comprises an n-type InP substrate 10, an i-type first InP layer 12, an i-type InGaAs light-receiving layer 14, a second InP layer 16, a first electrode 18, and a second electrode 24. The second region 10d on the second surface 10b of the InP substrate 10 is provided with the first electrode 18 as in the semiconductor light-receiving device 1a.

The semiconductor light-receiving device 1b further comprises a lens portion 26. In order to converge incident light to the InGaAs light-receiving layer 14, the lens portion 26 is arranged in the first region 10c through which light is transmittable to the InGaAs light-receiving layer 14. Since the lens portion 26 is separated from the InGaAs light-receiving layer 14 by a distance corresponding to the thickness of the semiconductor substrate 10, the introduced light reaches the light-receiving layer 14 after being converged by the lens portion 26 according to this distance. In this configuration, a projection area of the anode region 20 (20a, 20b), projected onto the plane 10a along an optical axis 28, can be made smaller than that of lens portion projected onto the plane 10b along an optical axis 28. Hence, parasitic capacitance associated with the anode region 20 can be reduced and a predetermined quantity of received light is secured.

Typically, the lens portion 26 may have a shape such as a substantially circular form. The maximum distance between two given points on the circumference of this substantially circular form may fall within the range of at least 100 $\mu$m but not exceeding 200 $\mu$m.

The thickness of the substrate 10 and buffer 16 should be determined in order to define the degree of convergence caused by the lens. The substrate 10 and buffer 16 may have a total thickness of 100 to 400 $\mu$m for a lens having the size mentioned above, e.g., a convex lens having a diameter ranging from 100 to 200 $\mu$m.

The anode region 20 can be positioned with respect to the optical axis 28 of the lens portion 26. This positioning allows the incident light through the lens portion 26 to efficiently reach the anode region 20 (20a, 20b). This positioning may be carried out in view of arrangements, such as the angle of incidence of light introduced into the semiconductor light-receiving device 1b. For example, there is a case where light to be detected is introduced in a direction inclined by a finite angle with respect to the optical axis 28.

An example of the method for forming such a lens portion 26 will now be described. A photoresist pattern defining the outer peripheral form of a lens portion, e.g., a circular photoresist pattern, is formed on a substrate surface. Then, the substrate is baked at such a temperature, e.g., about 200° C., that the photoresist does not burn. As a consequence, the photoresist pattern is softened, so that the surface of the photoresist deforms into a substantially spherical form under the action of surface tension. Subsequently, the photoresist and substrate are etched in an etching method and condition that are selected such that the etching rate of the substrate is substantially equal to that of the photoresist. When the etching is carried out until the resist is completely eliminated, then the spherical form of the photoresist is transferred to the substrate to complete a lens portion.

In the configuration of semiconductor light-receiving device 1b, the high-resistance i-type layer region of the InGaAs light-receiving layer 14 is arranged between the p-type semiconductor region 20a, 20b (anode), exhibiting a resistance lower than that of the i-type layer region, and the n-type semiconductor region 10, 16 (cathode) having a resistance lower than that of the i-type layer region.

Figure 3A:
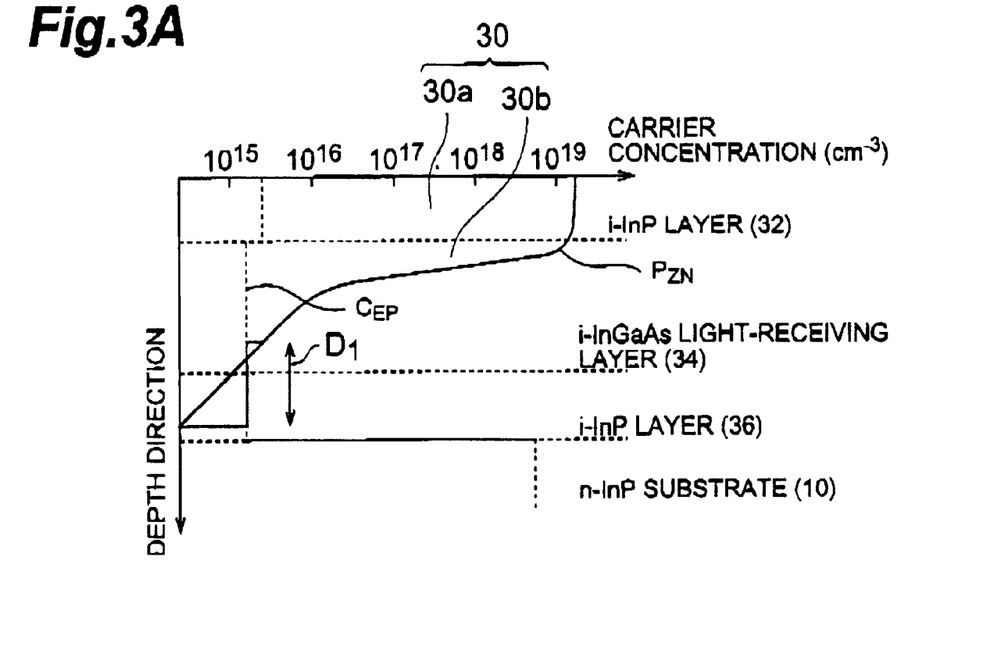
FIG. 3A is a chart showing a p-type dopant profile of a semiconductor light-receiving device for purposes of comparison.

FIG. 3A shows the dopant profile and carrier profile in an i-type first InP layer 32, an i-type InGaAs light-receiving layer 34, and an i-type second InP layer 36. Symbol Cap indicates the carrier concentration of the epitaxial layers. Symbol $P_{zn}$ indicates the profile of impurity element Zn. In the first InP layer 32 and InGaAs light-receiving layer 34, p-type semiconductor regions 30a, 30b can be formed by diffusing of impurity element Zn. As shown in FIG. 3A, a depletion layer $D_1$ spreads into both InGaAs light-receiving layer 34 and second InP layer 36 across the interface therebetween. When the second InP layer 36 have a carrier concentration of about $1 \times 10^{15}$ cm$^{-3}$, wave tails occurred in the measurements.

Figure 3B:
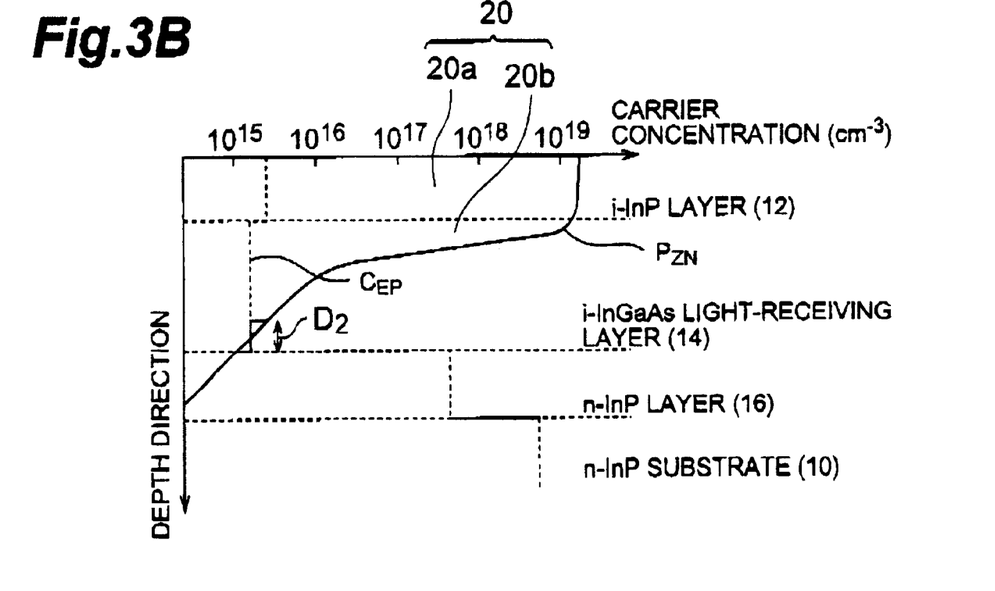
FIG. 3B is a chart showing a p-type dopant profile of the semiconductor light receiving devices shown in FIGS. 1 and 2.

FIG. 3B shows the dopant profile and carrier profile in the i-type first InP layer 12, i-type InGaAs light-receiving layer 14, and i-type second InP layer 16. Symbol $C_{EP}$ indicates the carrier concentration of the epitaxial layers. Symbol $P_{Zn}$, indicates the profile of impurity element Zn. In the first InP layer 12 and InGaAs light-receiving layer 14, the p-type semiconductor regions 20a, 20b can be formed by diffusion of impurity element Zn, for example. The InGaAS light-receiving layer 14 and second InP layer 16 have a substantially constant carrier profile, which represents epitaxial growth layers.

In the p-type semiconductor region 20b, the concentration of p-type dopant decreases in a direction from the first InP layer 12 to the second InP layer 16. Since the InGaAs light-receiving layer 14 has a high resistance, the width of i-type region in the InGaAs light-receiving layer 14 is determined according to the dopant profile. Therefore, the dopant profile in the InGaAs light-receiving layer 14 is one of factors that determine a light-receiving characteristic.

Variation factors concerning the above-mentioned light-receiving characteristic in manufacturing steps are assumed to include the thickness of each epitaxial layer grown on the substrate and the diffusion of p-type dopant. In actual manufacturing steps, it is not easy to introduce a p-type dopant into the epitaxial layers according to the thickness thereof so as to obtain the same impurity profile and light-receiving characteristics together because the thickness of the epitaxial layers differs among individual semiconductor light-receiving devices due to their manufacturing.

When the p-type dopant profile becomes deep in the conventional device, the depletion layer generated within the InGaAs light-receiving layer 34 yields a relatively small width. Thus, the depletion layer width in the second InP layer 36 becomes relatively large with respect to the whole depletion layer $D_1$.

If the second InP layer 16 has a carrier concentration of $1 \times 10^{17}$ cm$^{-3}$ or higher, then the a depletion layer $D_2$ caused by an electric field is restrained from spreading into the second InP layer 16. Hence, the voltage supplied to the semiconductor light-receiving device in accordance with this embodiment is efficiently applied to a region where photoelectric conversion should be caused, i.e., to InGaAs light-receiving layer 14.

According to experiments carried out by the inventor, the inventor has found that significant advantages are obtained when the carrier concentration of the second InP layer 16 satisfies the following:

|(carrier concentration of InP layer 16)/(carrier concentration of light-receiving layer 14)|≧5.

As described above, when the carrier concentration in the second InP layer 16 is increased, favorable characteristics are obtained. The inventor thinks that it is will be explained as follows.

Figure 4A:
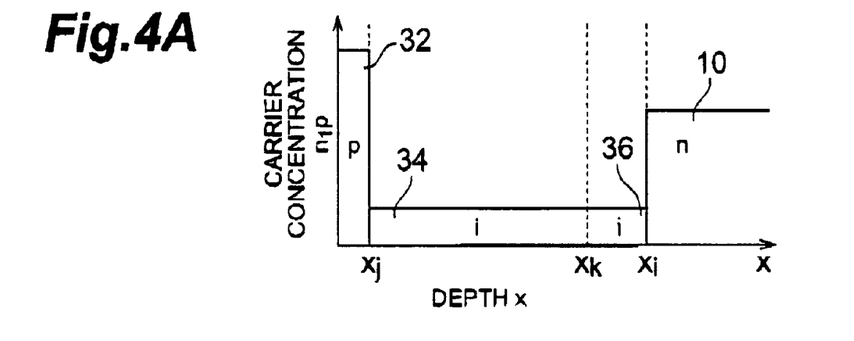
FIGS. 4A to 4D are charts for explaining a wave tail phenomenon in a semiconductor light-receiving device having the profile of FIG. 3A.

FIGS. 4A is a schematic view showing the carrier concentration in a conventional semiconductor light-receiving device. For simplifying the explanation, it represents a case where the light-receiving layer 34 and second InP layer 36 have a constant carrier concentration.

Figure 4B:
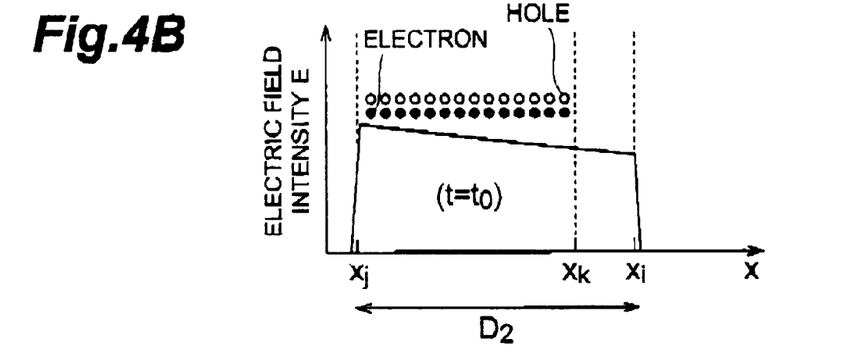

FIG. 4B shows generated electron-hole pairs and the distribution of an electric field generated by an applied voltage. The applied voltage is mainly supplied to both light-receiving layer 34 and second InP layer 36, and generates an electric field in these layers. When this semiconductor light-receiving device receives light, electron-hole pairs are generated in the second InP layer 34. When the semiconductor light-receiving device receives light steadily, many electron-hole pairs are generated by an amount corresponding to the quantity of light, whereby the electrons and holes are attracted to the cathode and anode, respectively.

Figure 4C:
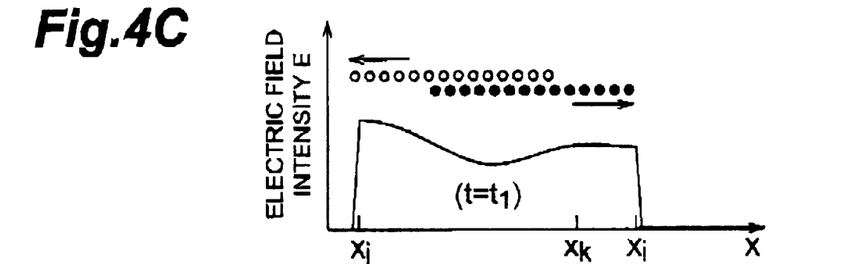

FIG. 4C shows a combined electric field distribution, and the movement of the electrons and holes just after the interruption of the received optical signal. The electrons and holes are attracted to the cathode and anode, respectively, under the action or applied voltage. Therefore, Coulomb force acts between the electrons and holes. The electric fields of Coulomb force partially cancels the electric fields of the applied voltage to form the combined electric field distribution in the depletion layer. This cancellation lowers the carrier drift speed in the region where the combined electric field is weakened.

Figure 4D:
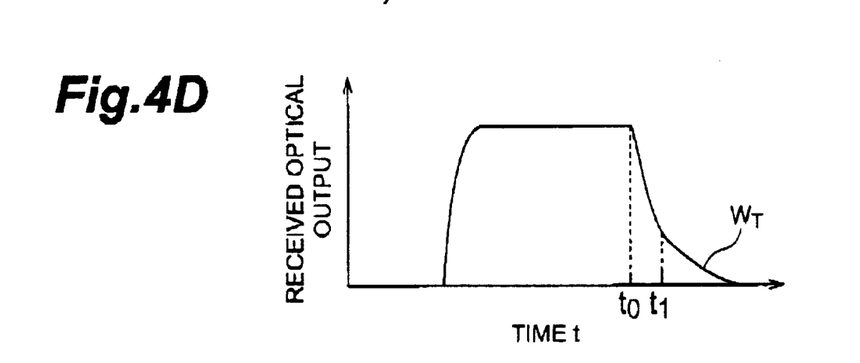

FIG. 4D shows the pulse waveform in response to received light. As shown in FIG. 4D, the reduction in the drift speed of the carriers generates a wave tail $W_T$ after the electric pulse signal generated by an optical pulse signal. If the wave tail is assumed to result from the Coulomb force between the electrons and holes, then there is no contradiction to the fact that the wave tail occurs remarkably when the quantity of received light is large. Such a p-i-n type photodiode may operate under a relatively large quantity of received light when used to a light monitoring element for a laser diode in an optical communication module.

The inventor has found that the wave tail may be eliminated even at low applied voltages if the applied voltage can efficiently be supplied to a region in which electron-hole pairs can be generated.

In the conventional semiconductor light-receiving device, the carrier concentration of the second InP layer 36 has been reduced to about $1\times10^{15}$ cm$^{-3}$ in order to lower the parasitic capacitance and improve the response speed. Under operation conditions at which wave tails may be generated, however, simply lowering the parasitic capacitance cannot yield a semiconductor light-receiving device suitable for an optical communication module.

The inventor thinks it preferable for the second InP layer 16 to have a carrier concentration of $1\times10^{17}$ cm$^{-3}$ or higher in order to lower the parasitic capacitance and prevent the occurrence of the wave tails. On the other hand, the carrier concentration is about $1\times10^{19}$ cm$^{-3}$ at the maximum.

For verifying the foregoing consideration in practice, the inventor conducted various experiments as follows.

Figure 5A:
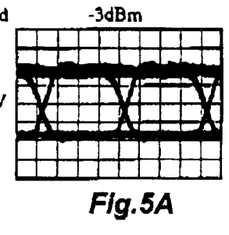
FIGS. 5A to 5R are waveform charts of a semiconductor light receiving device having the profile of FIG. 3B.
Figure 5B:
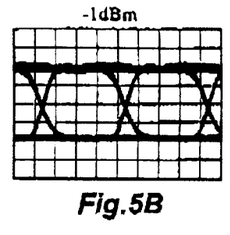
Figure 5C:
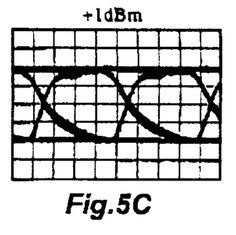
Figure 5D:
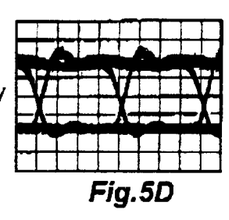
Figure 5E:
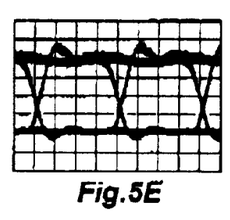
Figure 5F:
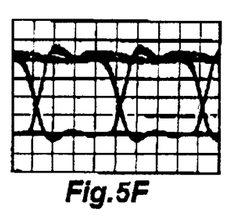
Figure 5G:
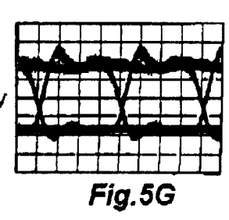
Figure 5H:
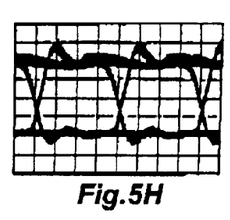
Figure 5I:
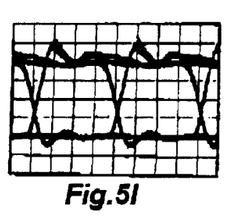
Figure 5J:
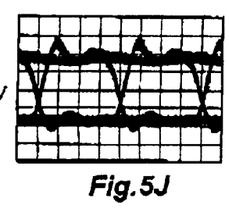
Figure 5K:
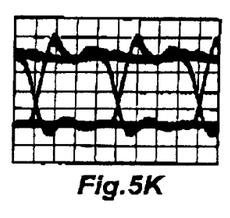
Figure 5L:
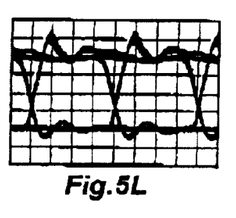
Figure 5M:
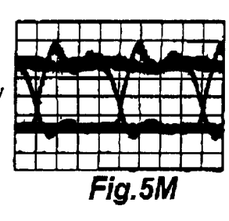
Figure 5N:
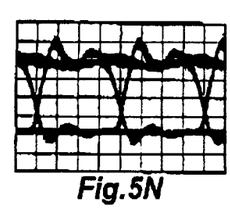
Figure 5O:
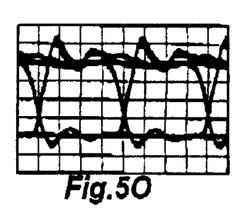
Figure 5P:
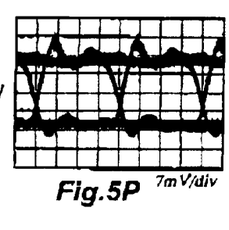
Figure 5Q:
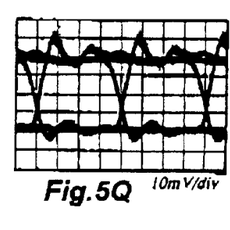
Figure 5R:
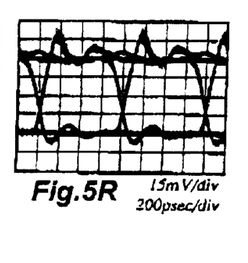
Figure 6A:
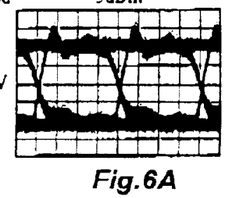
FIGS. 6A to 6R are waveform charts of a semiconductor light-receiving device having the profile of FIG. 3A.
Figure 6B:
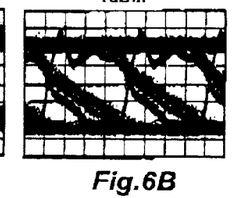
Figure 6C:
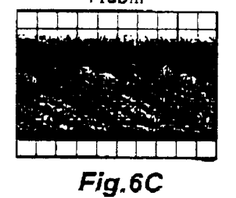
Figure 6D:
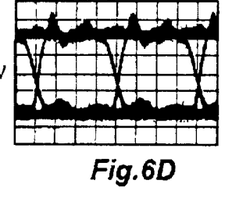
Figure 6E:
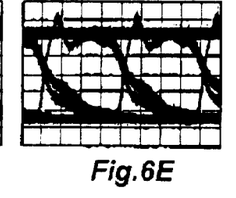
Figure 6F:
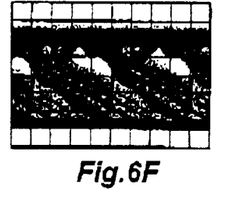
Figure 6G:
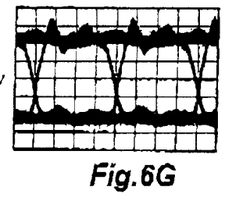
Figure 6H:
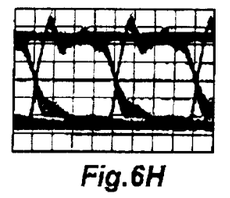
Figure 6I:
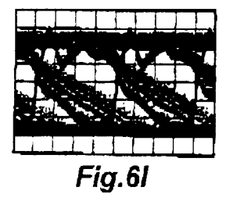
Figure 6J:
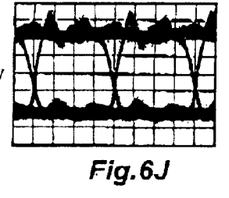
Figure 6K:
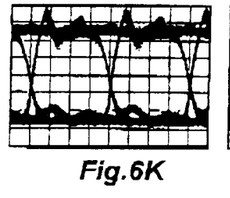
Figure 6L:
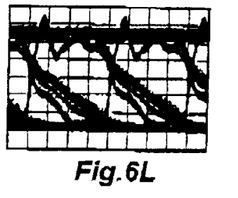
Figure 6M:
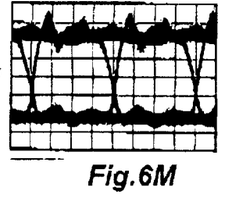
Figure 6N:
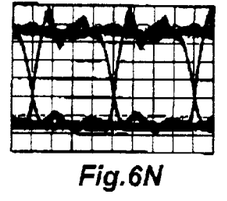
Figure 6O:
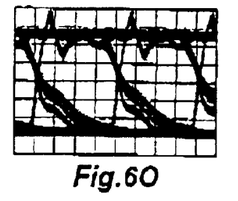
Figure 6P:
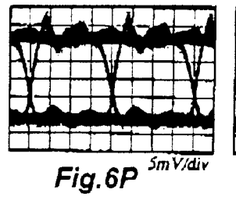
Figure 6Q:
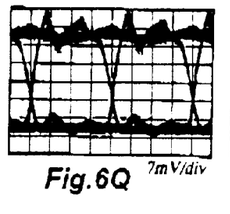
Figure 6R:
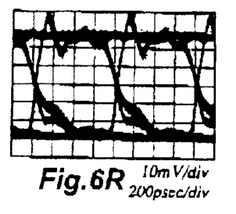

FIGS. 5A to 5R show the measurements on the semiconductor light-receiving device in accordance with an embodiment of the present invention. In the measurements, the applied voltage $V_{pd}$ is changed from 0.0 V to 2.0 V in increments of 0.4 V. FIGS. 6A to 6R show the measurements of a semiconductor light-receiving device having the profile shown in FIG. 3A. In the measurements, the applied voltage $V_{pd}$ is changed from 1.0 V to 2.0 V in increments of 0.2 V. FIGS. 5A to 5R and 6A to 6R show the measurements in the optical signal intensities of −3 dBm, −1 dBm, and +1 dBm, respectively. FIGS. 5A to 5R show that no practically problematic wave tails are observed in the measurements even when the received optical signal intensity is relatively high or even when the applied voltages are relatively low. In contrast to the measurements in FIG. 6A to 6R, FIGS. 5A to 5R show that more remarkable wave tails are observed in the measurements as the received optical signal intensity is higher and as the applied voltage is lower.

Figure 7:
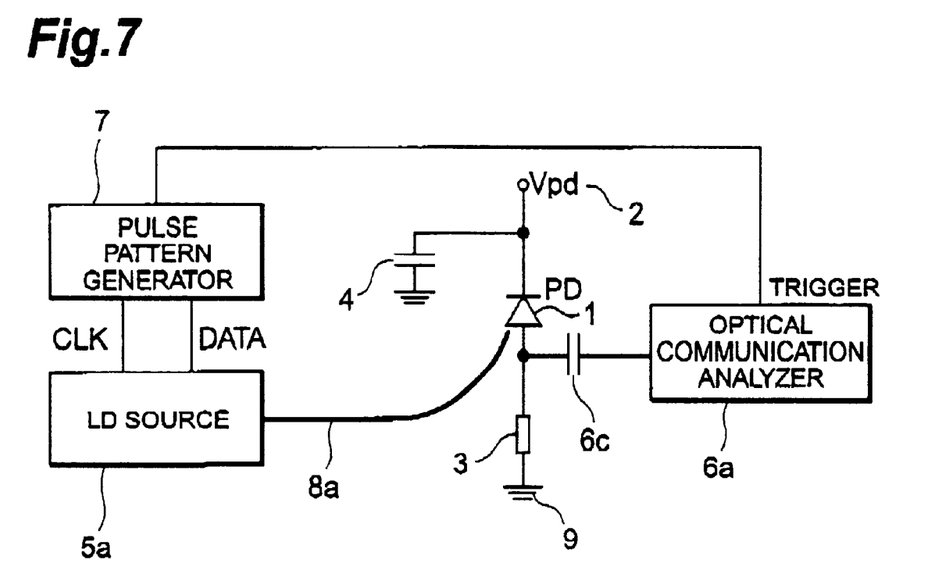
FIG. 7 is a diagram showing a measurement system used for the measurements shown in FIGS. 5A to 5R and 6A to 6R.

FIG. 7 shows a measurement system used in the measurements above with light wavelength λ=1.31 μm. In FIG. 7, a power supply $V_{pd}$ 2 and a bypass capacitor 4 are connected to the cathode of a semiconductor light-receiving device 1 under test. The anode is connected to a grounding conductor by way of a load element 3. A laser light source 5a generates light, which is introduced into the semiconductor light-receiving device 1 by way of an optical waveguide 8a. The laser light source 5a is driven by a pulse pattern generator 7. The measurements can be carried out using an optical communication analyzer 6a. The optical communication analyzer 6a is connected to the anode of semiconductor light-receiving device 1 by way of a probe 6c having a coupling capacitor. The measurement conditions are as follows: a measurement signal bit rate of 1.25 Gb/s and PRBS =$2^{23}-1$.

Figure 8A:
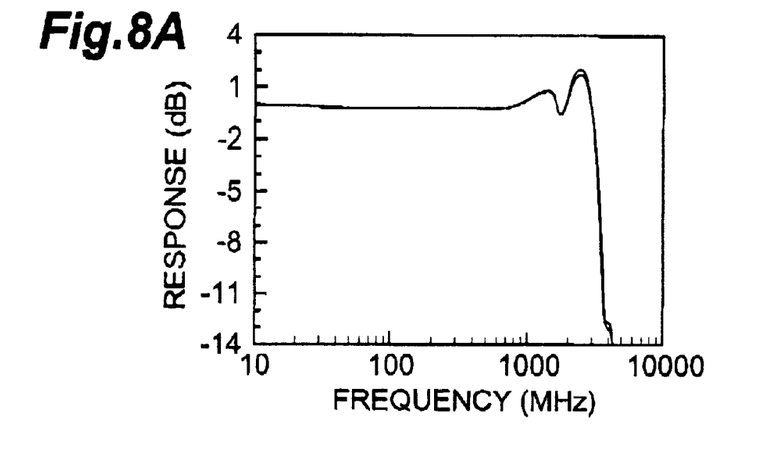
Figure 8B:
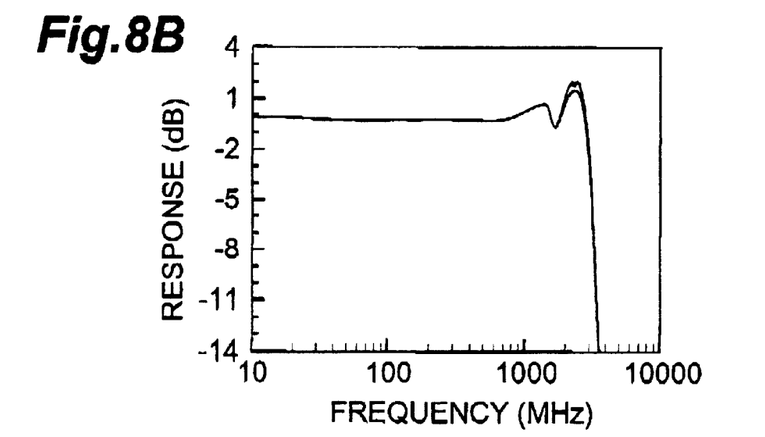
Figure 8C:
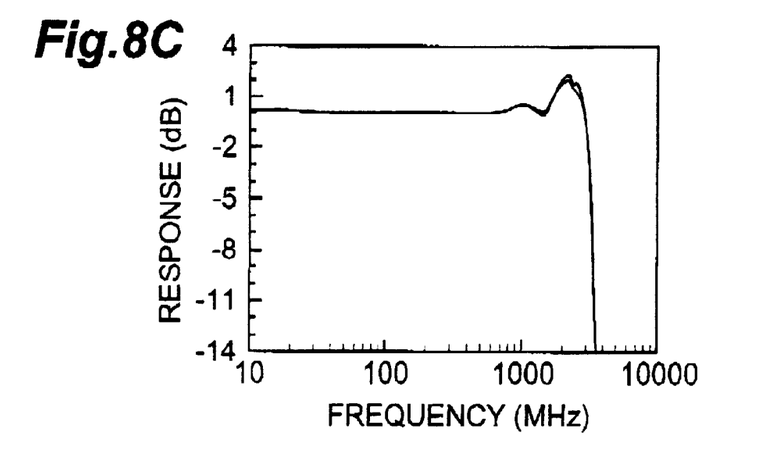
Figure 9A:
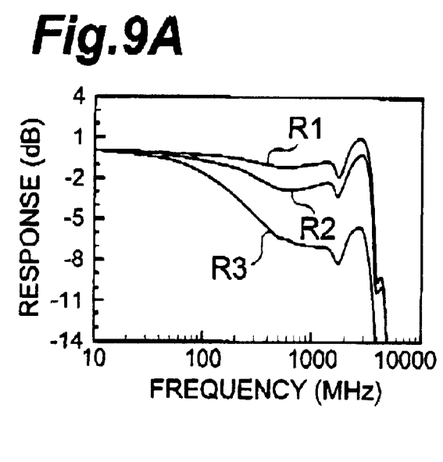
Figure 9B:
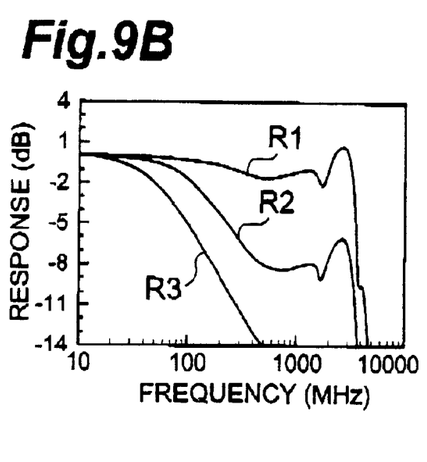
Figure 9C:
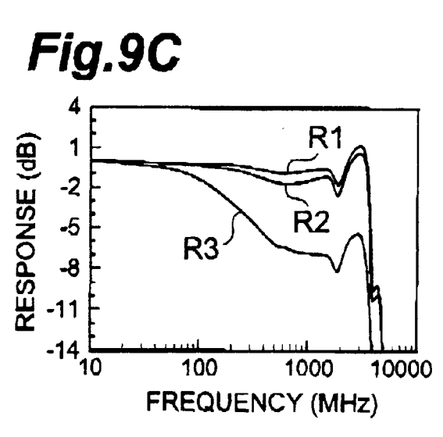
Figure 9D:
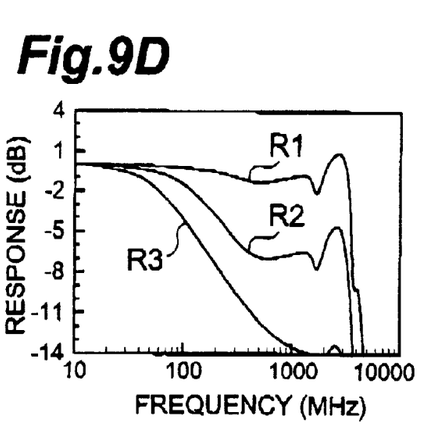
Figure 9E:
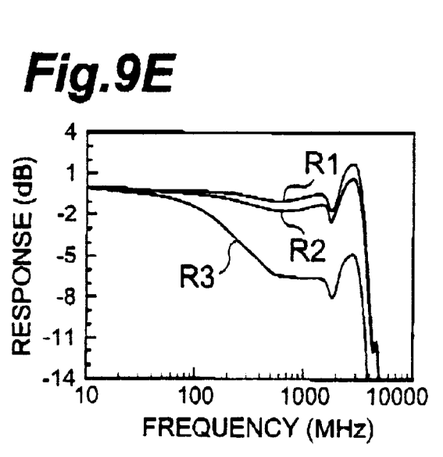
Figure 9F:
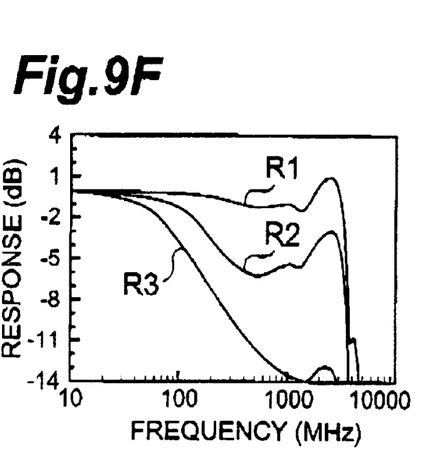

FIGS. 8A to 8C show frequency characteristic, measured in the optical signal intensities of −3 dBm, −1 dBm, +1 dBm, and +4.9 dBm, of the semiconductor light-receiving device in accordance with an embodiment. FIGS. 9A to 9F show the frequency characteristics, measured in the optical signal intensities of −3 dBm (R1 characteristic), −1 dBm (R2 characteristic), and +1 dBm (R3 characteristic), of a semiconductor light-receiving device having the profile shown in FIG. 3A. FIGS. 8A to 8C and 9A to 9F show the measurements in the applied voltage of $V_{pd}$=1.2 volts.

When FIGS. 8A to 8F and FIGS. 9A to 9F are compared with each other, the result at the optical signal intensity of +4.9 dBm is still substantially equal to that at the optical signal intensity of −3 dBm in the frequency characteristic of the semiconductor light-receiving device in accordance with the embodiment of the present invention. In the semiconductor light-receiving device having the profile shown in FIG. 3A, by contrast, the bandwidth becomes smaller as the input light intensity is greater, thereby yielding a remarkable difference in frequency characteristics in a higher frequency region.

Figure 10:
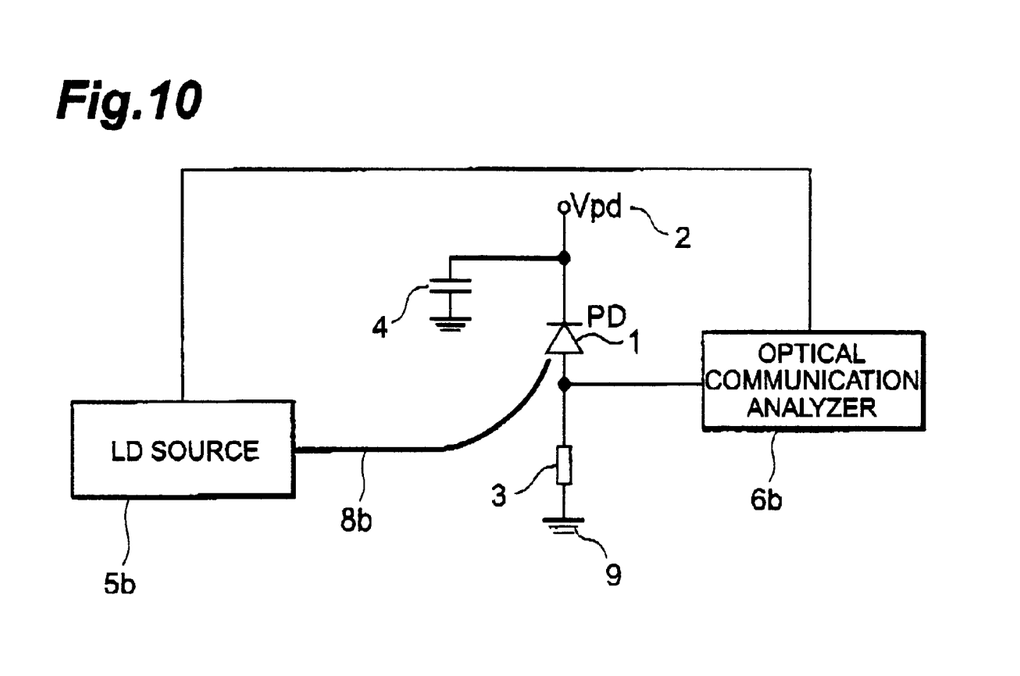
FIG. 10 is a diagram showing a measurement system used for the measurements shown in FIGS. 9A to 9F.

FIG. 10 shows the measurement system used in these measurements with light wavelength λ of 1.55 μm. The cathode of a semiconductor light-receiving device 1 under test is connected to a power supply $V_{pd}$ 2 and a bypass capacitor 4. The anode is connected to a ground line by way of a load element 3. A laser light source 5b generates light having individual wavelengths, which is introduced into the semiconductor light-receiving device 1 by way of an optical waveguide 8b. The laser light source 5b is driven at a frequency within the range from a relatively low frequency (e.g., 10 MHz) to a relatively high frequency (e.g., several GHz). The measurements are carried out using an optical communication analyzer 6b.

What is claimed is:

1. A semiconductor light-receiving device comprising:
   a first InP layer including a first semiconductor region having a first conductive type;
   a second InP layer including a second semiconductor region having a second conductive type different from the first conductive type; said first InP layer being provided on said second InP layer; and
   an InGaAs light-receiving layer provided between said first and second InP layers;
   wherein said second semiconductor region in said second InP layer has a carrier concentration of $1 \times 10^{17}$ cm$^{-3}$ or higher.

2. A semiconductor light-receiving device according to claim 1, further comprising a substrate;
   wherein said first InP layer is provided on said substrate.

3. A semiconductor light-receiving device according to claim 2, wherein said InGaAs light-receiving layer has an i-type semiconductor region.

4. A semiconductor light-receiving device according to claim 2, wherein said first semiconductor region in said first InP layer has a p-type semiconductor region;
   wherein said second semiconductor region in said second InP layer has an n-type semiconductor region;
   wherein said InGaAs light-receiving layer has an i-type semiconductor region; and
   wherein said substrate is an n-type semiconductor substrate.

5. A semiconductor light-receiving device according to claim 1, wherein said InGaAs light-receiving layer has a dopant profile indicating a distribution of first conductive type dopant concentration, said dopant profile decreasing in a direction from said second InP layer to said first InP layer.

6. A semiconductor light-receiving device according to claim 5, wherein said first conductive type dopant includes Zn.

7. A semiconductor light-receiving device according to claim 1, further comprising a first conductive type InP substrate;
   wherein said InP substrate has a first surface and a second surface opposite to said first surface; said first surface being provided with said first InP layer, said InGaAs light-receiving layer, and said second InP layer;
   wherein said second surface of said InP substrate has first and second regions;
   wherein a first electrode is provided on said second surface of said InP substrate; and
   wherein said first electrode is provided in said second region.

8. A semiconductor light-receiving device according to claim 7, wherein said InP substrate has a lens portion in said first region of said second surface.

9. A semiconductor light-receiving device according to claim 7, wherein said lens portion has a monolithic lens.

10. A semiconductor light-receiving device according to claim 7, further comprising a second electrode;
    wherein said first InP layer, said InGaAs light-receiving layer, and said second InP layer are provided between said second electrode and said InP substrate;
    wherein said first semiconductor region is provided in said first InP layer so as to electrically connect said InGaAs light-receiving layer to said second electrode; and
    wherein an area of said lens portion projected onto said second surface is larger than that of said first semiconductor region projected onto said first surface.

* * * * *